United States Patent
Chiang et al.

(10) Patent No.: US 8,490,030 B1
(45) Date of Patent: Jul. 16, 2013

(54) DISTANCE METRIC FOR ACCURATE LITHOGRAPHIC HOTSPOT CLASSIFICATION USING RADIAL AND ANGULAR FUNCTIONS

(75) Inventors: Charles C. Chiang, Saratoga, CA (US); Jing Guo, Shanghai (CN); Fan Yang, Shanghai (CN); Subarnarekha Sinha, Palo Alto, CA (US); Xuan Zeng, Shanghai (CN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/487,047

(22) Filed: Jun. 1, 2012

(51) Int. Cl.
*G06F 17/50* (2006.01)
(52) U.S. Cl.
USPC .............................................. 716/52; 716/51
(58) Field of Classification Search
USPC ....................................................... 716/50–56
See application file for complete search history.

(56) References Cited

U.S. PATENT DOCUMENTS

| | | | |
|---|---|---|---|
| 7,096,449 B1* | 8/2006 | Teig et al. ................ | 716/129 |
| 7,114,141 B1* | 9/2006 | Teig et al. ................ | 716/129 |
| 7,117,468 B1* | 10/2006 | Teig et al. ................ | 716/129 |
| 2010/0203430 A1* | 8/2010 | Ye et al. .................. | 430/5 |

OTHER PUBLICATIONS

Arkin, Esther M.; et al. "An Efficiently Computable Metric for Comparing Polygonal Shapes", IEEE Transactions on Pattern Analysis and Machine Intelligence, vol. 13, No. 3, Mar. 1991, pp. 209-216.

Ding, Duo; et al. "High Performance Lithographic Hotspot Detection using Hierarchically Refined Machine Learning", Asia and South Pacific Design Automation Conference (ASPDAC), Yokohama, Japan, Jan. 25-28, 2011, 6 pages.

Ding, Duo; et al. "Machine Learning based Lithographic Hotspot Detection with Critical-Feature Extraction and Classification", IEEE International Conference on IC Design and Technology, May 18-20, 2009, pp. 219-222.

Ganti, Venkaesh; et al. "Clutsering Large Datasets in Arbitary Metric Spaces", 15th International Conference on Data Engineering, Mar. 23-26, 1999, pp. 502-511.

Huang, Li-Da and Martin D. F. Wong. "Optical Proximity Correction (OPC)—Friendly Maze Routing", DAC 2004, San Diego, California, USA, Jun. 7-11, 2004, pp. 186-191.

Hubert, Lawrence and James Schultz. "Quadratic Assignment as a General Data Analysis Strategy", British Journal of Mathematical and Statistical Psychology, vol. 29, No. 2, Nov. 1976, pp. 190-241.

Johnson, Stephen C. "Hierarchical Clustering Schemes", Psychometrika, vol. 32, No. 3, Sep. 1967, pp. 241-254.

(Continued)

*Primary Examiner* — Thuan Do
*Assistant Examiner* — Binh Tat
(74) *Attorney, Agent, or Firm* — Bever, Hoffman & Harms, LLP; Jeanette S. Harms

(57) ABSTRACT

An dual function distance metric for pattern matching based hotspot clustering is described. The dual function distance metric can handle patterns containing multiple polygons, is easy to compute, and is tolerant of small variations or shifts of the shapes. Compared with an XOR distance metric pattern clustering, the dual function distance metric can achieve up to 37.5% accuracy improvement with 2X-4X computational cost in the context of cluster analysis. The dual function distance metric is reliable and accurate for characterizing clips (e.g. hotspots), thereby making it desirable for industry applications.

22 Claims, 14 Drawing Sheets

OTHER PUBLICATIONS

Latecki, Longin Jan and Rolf Lakamper. "Shape Similarity Measure Based on Correspondence of Visual Parts", IEEE Transactions on Pattern Analysis and Machine Intelligence, vol. 22, No. 10, Oct. 2000, pp. 1-6.

Luk-Pat, Gerard T.; et al. "Correcting Lithography Hot Spots during Physical-Design Implementation", Photomask Technology 2006, Proceedings of the SPIE, vol. 6349, pp. 634920 (1-9).

Ma, Ning. "Automatic IC Hotspot Classification and Detection using Pattern-Based Clustering", PhD Thesis, Engineering, Mechanical Engineering, University of California, Berkeley, 2009, 106 pages.

Milligan, Glenn W. "A Monte Carlo Study of Thirty Internal Criterion Measures for Cluster Analysis", Psychometrika, vol. 46, No. 2, Jun. 1981, pp. 187-199.

Mitra, Joydeep; et al. "RADAR: RET-Aware Detailed Routing Using Fast Lithography Simulations", DAC 2005, Anaheim, California, USA, Jun. 13-17, 2005, pp. 369-372.

Park, Chul-Hong; et al. "A systematic approach to correct critical patterns induced by the lithography process at the full-chip level", SPIE Conference on Optical Microlithography XII (SPIE vol. 3679), Santa Clara, California, USA, Mar. 1999, pp. 622-629.

Yao, H.; et al. "Efficient Process-Hotspot Detection Using Range Pattern Matching", ICCAD 2006, San Jose, California, USA, Nov. 5-9, 2006, pp. 625-632.

* cited by examiner

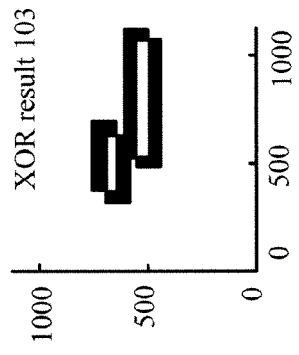
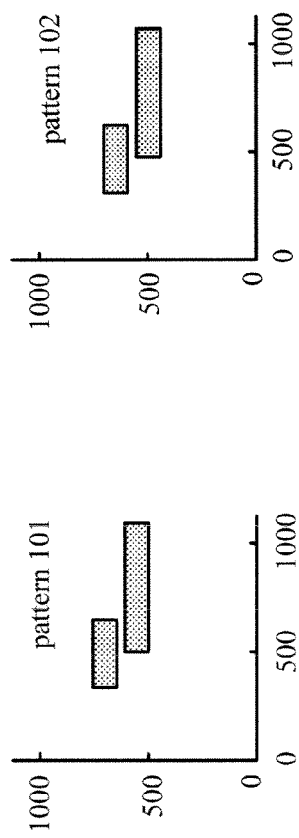
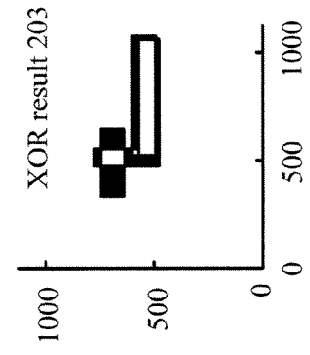
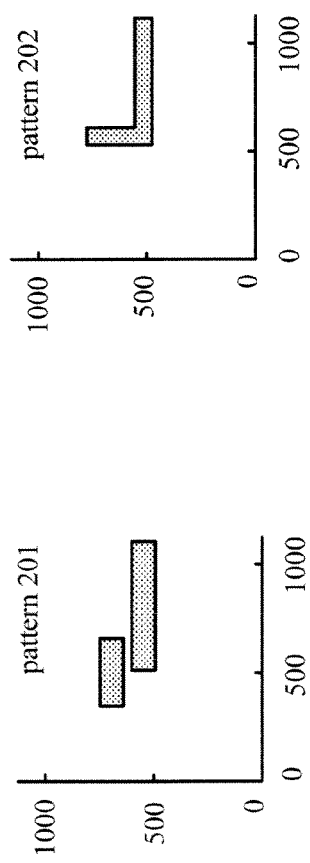

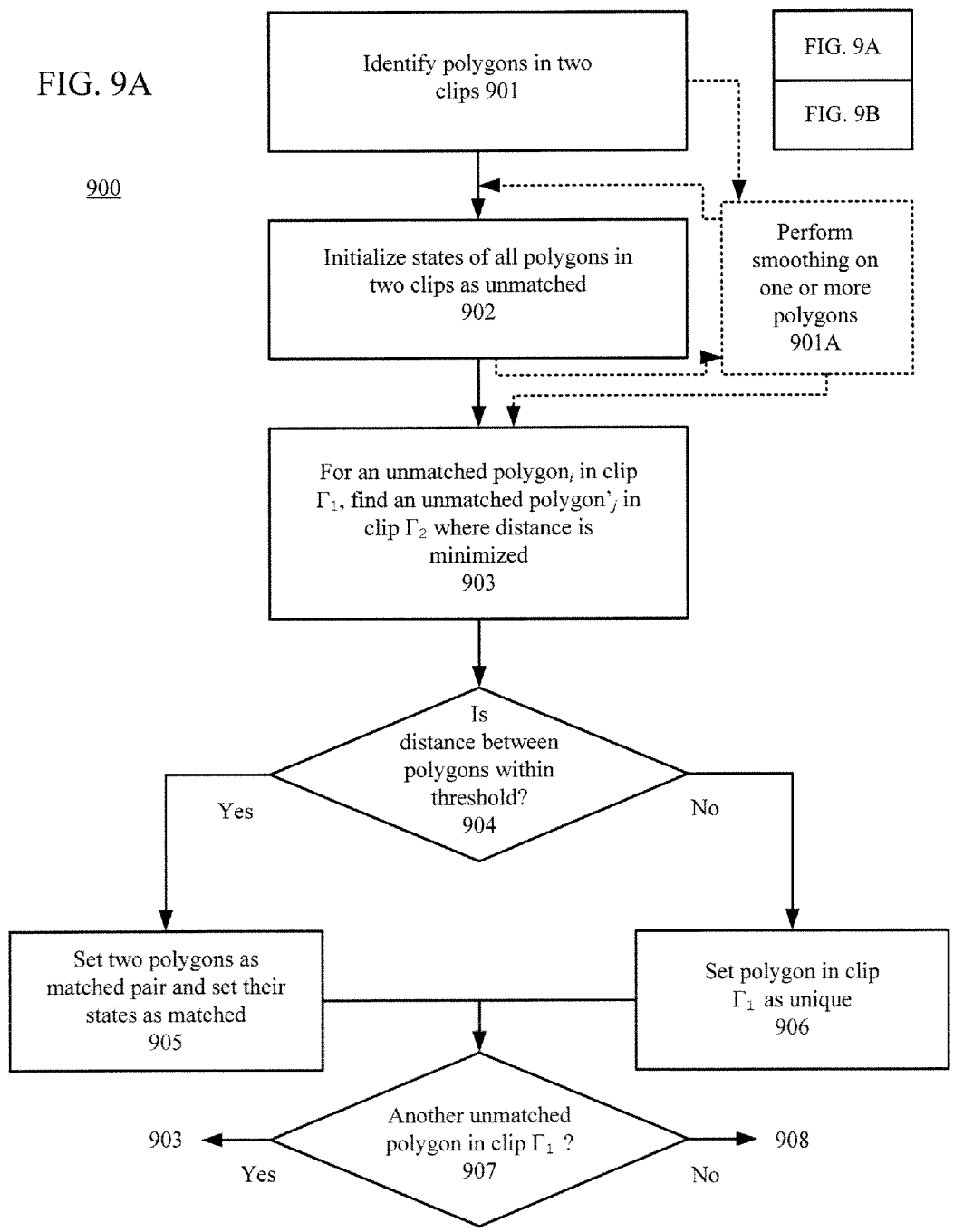

DISTANCE METRIC FOR ACCURATE LITHOGRAPHIC HOTSPOT CLASSIFICATION USING RADIAL AND ANGULAR FUNCTIONS

BACKGROUND

1. Field of the Art

The present disclosure relates to grouping patterns of an integrated circuit (IC) design, and in particular to those patterns of the IC design in which lithographic distortions may occur, which are called "hotspots".

2. Related Art

In designing an integrated circuit (IC), engineers typically rely upon computer simulation tools to help create a circuit schematic design consisting of individual devices coupled together to perform a certain function. To actually fabricate this circuit in a semiconductor substrate, the circuit must be translated into a physical representation, or layout, which itself can then be transferred onto a template (i.e. mask), and then to the silicon surface. Again, computer aided design (CAD) tools assist layout designers in the task of translating the discrete circuit elements into polygons which will embody the devices themselves in the completed IC. These polygons make up the individual components of the circuit, such as gate electrodes, field oxidation regions, diffusion regions, metal interconnections, and so on.

Once the layout of the circuit has been created, the next step to manufacturing the IC is to transfer the layout onto a semiconductor substrate. One way to do this is to use the process of optical lithography in which the layout is first transferred onto a physical template which is in turn used to optically project the layout onto a silicon wafer.

In transferring the layout to a physical template, a mask (e.g. a quartz plate coated with chrome) is generally created for each layer of the integrated circuit design. This is done by inputting the data representing the layout design for that layer into a device such as an electron beam machine, which writes the IC layout pattern into the mask material. In less complicated and dense integrated circuits, each mask comprises the geometric shapes (polygons) which represent the desired circuit pattern for its corresponding layer. In more complicated and dense circuits in which the size of the circuit features approach the optical limits of the lithography process, the masks may also comprise optical proximity correction features such as serifs, hammerheads, bias and assist bars which are designed to compensate for proximity effects. In other advanced circuit designs, phase shifting masks may be used to circumvent certain basic optical limitations of the process by enhancing the contrast of the optical lithography process.

These masks are then used to optically project the layout onto a silicon wafer coated with photoresist material. For each layer of the design, a light is shone on the mask corresponding to that layer via a visible light source or an ultra-violet light source. This light passes through the clear regions of the mask, whose image exposes the underlying photoresist layer, and is blocked by the opaque regions of the mask, leaving that underlying portion of the photoresist layer unexposed. The exposed photoresist layer is then developed, typically, through chemical removal of the exposed/non-exposed regions of the photoresist layer. The end result is a semiconductor wafer coated with a photoresist layer exhibiting a desired pattern which defines the geometries, features, lines and shapes of that layer. This process is then repeated for each layer of the design.

Optical proximity correction (OPC) applies systematic changes to geometries of the layout to improve the printability of a wafer pattern. Specifically, as the size of integrated circuit features drops to 0.18μ and below, the features can become smaller than the wavelength of the light used to create such features, thereby creating lithographic distortions when printing the features onto the wafer. These lithographic distortions can represent significant impacts on device performance.

Rule-based OPC can include rules to implement certain changes to the layout, thereby compensating for some lithographic distortions. For example, to compensate for line-end shortening, rule-based OPC may add a hammerhead to a line end. To compensate for corner rounding, rule-based OPC can add (or subtract) serif shapes from outer (or inner) corners. These changes can form features on the wafer that are closer to the original intended layout. Unfortunately, the more complex lithographic effects cannot be efficiently described by simple geometric rules.

In another type of resolution enhancement technique, lithographic simulation can be used to detect areas where lithographic distortions may occur, which are called "hotspots" herein. In model-based OPC, a real pattern transfer can be simulated (i.e. predicted) with a set of mathematical formulas (i.e. models). In this simulation, the edges of a feature (i.e. a polygon) in a layout can be dissected into a plurality of segments, thereby allowing these segments to be individually moved to correct for proximity effects. The placement of the dissection points is determined by the feature shape, size, and/or position relative to other features. Unfortunately, model-based OPC has a high computational cost, which makes it impractical for hotspot detection at early design stages.

Some features in a layout may not be lithographically resolved using rule-based or model-based OPC. In such cases, the foundry may issue a design rule change that prohibits such features from being used in a layout.

Currently, during a process ramp-up, one or more test chips may be fabricated to identify "hotspots", i.e. specific patterns that are difficult to lithographically resolve. These hotspots are typically manually identified and placed in a hotspot file for further analysis. Notably, typical a hotspot file includes thousands of hotspots. Manually lithographically resolving each of these hotspots is tedious and time-intensive, thereby adding considerable expense to the process ramp-up.

Clustering hotspots into groups for analysis would save considerable time. For example, a first cluster of hotspots having a similar pattern could be lithographically resolved using design-based OPC, a second cluster of hotspots having a similar pattern (but different from the first cluster) could be lithographically resolved using model-based OPC, and a third cluster of hotspots having a similar pattern (and different from the first and second clusters) cannot be lithographically resolved, thereby resulting in a design rule change prohibiting that pattern. Clustering hotspots would accelerate the lithographic resolution for each type of pattern, rather than each pattern, thereby significantly increasing the efficiency and minimizing cost of the process ramp-up.

Therefore, a need arises for a technique that accurately characterizes hotspots at a reasonable computational cost.

SUMMARY

Although various resolution enhancement techniques (RETs) have been used to improve lithographic printability, lithographic hotspots may still cause manufacturability problems and inefficiencies, which may result in deterioration of the yield. Therefore, it is essential to resolve hotspots at early design stages.

A method of characterizing a plurality of clips of an integrated circuit layout for clustering is described. Note that a hotspot and its local surrounding context are defined as a "clip". In this method, the polygons of a first clip and a second clip are identified. The states of all polygons in the first and second clips are initialized as unmatched. For a first unmatched polygon in the first clip, a second unmatched polygon in the second clip is found where a distance metric between the first and second unmatched polygons is minimized. The distance metric can be computed by integrating the differences of both radial and angular functions of the first unmatched polygon in the first clip and the second unmatched polygon in the second clip. The distance metric can advantageously provide a quantitative measure of similarity between the two polygons.

When the distance metric is less than a predefined threshold, the first and second unmatched polygons can be set as a matched pair, and the states of the first and second unmatched polygons can be set as matched. In contrast, when the distance metric is not less than the predefined threshold, the state of the first unmatched polygon can be set as unique. Remaining unmatched polygons in the first and second clips can be processed in a similar manner. After all polygons have been set to matched or unique, the matched distances for all matched pairs and the unmatched distances for all unique polygons can be calculated. At this point, a total distance for the first and second clips can be computed by summing all matched distances and all unmatched distances.

The method steps up to and including computing the total distance can be repeated after rotating or flipping one of the two clips (for example, the first clip) multiple times. In one embodiment, the total distance for each of eight transformations can be computed. At this point, a minimized total distance metric from the eight transformations can be determined. Notably, the minimized total distance determines whether the first and second clips should be clustered.

Integrating differences of the radial function of the first unmatched polygon in the first clip and the second unmatched polygon in the second clip includes computing $$d_R(A, A') = \left[ \int_0^1 w(x, y)|R_A(s) - R_{A'}(s)|^2 ds \right]^{\frac{1}{2}},$$

where $w(x, y)$ is a weighting function and $R(s)$ is radial function of a normalized edge length for each of the first unmatched polygon (A) and the second unmatched polygon (A'). Integrating differences of the angular function of the first unmatched polygon in the first clip and the second unmatched polygon in the second clip includes computing $$d_\Theta(A, A') = \left[ \int_0^1 |\Theta_A(s) - \Theta_{A'}(s)|^2 ds \right]^{\frac{1}{2}},$$

where the angular function gives angular coordinates of turning vertices as a function $\Theta(s)$ of a normalized polygon edge length s for each of the first unmatched polygon (A) and the second unmatched polygon (A'). Calculating unmatched distances for all unique polygons includes computing $$\left( \int_0^1 |R_C(s)|^2 ds \right)^{\frac{1}{2}} * \left( \int_0^1 |\Theta_C(s)|^2 ds \right)^{\frac{1}{2}},$$

where $R(s)$ is the radial function over a normalized polygon edge length s for a unique polygon (C) and $\Theta(s)$ is the angular function of the normalized polygon edge length s for the unique polygon (C).

In one embodiment, the method can further include forming a distance matrix of a plurality of minimized total distance metrics corresponding to a plurality of clips. The eight transformations can include rotating the first clip by 0, 90, 180, or 270 degrees and providing an x or y mirror. In one embodiment, the method can further include smoothing an edge of at least one of the first and second unmatched polygons.

The above-described method using both radial and angular functions, called a dual function distance metric herein, can be used for pattern matching for hotspot classification. The dual function distance metric can advantageously handle patterns containing multiple polygons. At the same time, it is easy to compute and is tolerant to small variations or shifts of the polygons. Compared with a conventional distance metric based on an XOR of the hotspots, the dual function distance metric can achieve up to 37.5%, accuracy improvement with at most 4.3× computational cost in the context of cluster analysis. Although the computational cost of the dual function distance metric is a somewhat higher than that of the XOR based metric, the reliability and accuracy of the dual function distance metric render it desirable for hotspot cluster classification in industrial applications.

A non-transitory, computer-readable medium storing computer-executable instructions for characterizing a plurality of clips of an integrated circuit layout for clustering is also described. The computer-executable instructions when executed by a processor can perform the above-described steps. A processor configured to characterize a plurality of clips of an integrated circuit layout for clustering is also described. The processor is configured to execute instructions for performing the above-described steps.

BRIEF DESCRIPTION OF THE DRAWINGS

FIGS. 1A and 1B illustrate exemplary polygon patterns.
FIG. 1C illustrates an XOR of the patterns in FIGS. 1A and 1B.
FIGS. 2A and 2B illustrate exemplary polygon patterns.
FIG. 2C illustrates an XOR of the patterns in FIGS. 2A and 2B.

FIGS. 9A and 9B illustrate an exemplary dual function distance metric technique for classifying clips of a layout.

DETAILED DESCRIPTION OF THE DRAWINGS

Figure 2D:
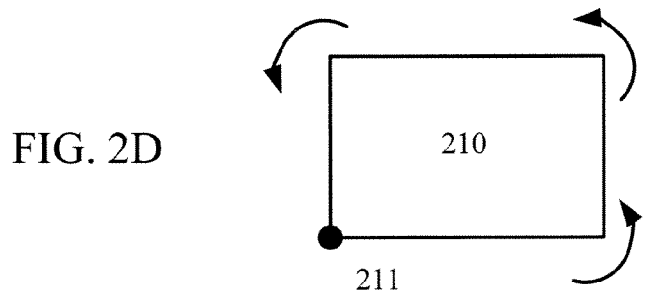
FIGS. 2D and 2E illustrate a rectangle and its turning function.

In accordance with one aspect of an improved resolution enhancement technique (RET), hotspots of a layout design can be grouped. This grouping technique, called hotspot classification herein, uses a dual function distance metric, which is sensitive to change-of-scale and differences in orientation of a polygon pattern. Notably, polygon patterns (also called "drawn shapes" in a foundry) in a group can be treated similarly for optical proximity correction and/or other layout processing (e.g. phase shifting), thereby saving significant time compared to the conventional individual processing of polygon patterns.

As described in further detail below, this dual function distance metric is a pattern matching based method rather than a machine learning method. In machine learning based methods, a neural network or a support vector machine-based regression model is built from a set of training hotspot patterns. The regression models are then used to predict or detect the hotspots. For the successful application of these regression models for hotspot detection, an extensive set of training patterns is needed.

In contrast, pattern matching based methods employ explicit models rather than regression models to depict the hotspot patterns. Thus, hotspot detection is actually a matching process based on explicit models. Pattern matching based methods are generally faster and more accurate than the machine learning based methods for hotspot detection, if an accurate model for the hotspot patterns is defined. A range of patterns may be used to account for tolerant variations of conventional design rules.

In one embodiment, a pattern matching based hotspot classification scheme groups extracted hotspots (i.e. already identified or detected hotspots) using data mining methods. A typical data mining method includes fabricating one or more test chips for a new process node and/or recipe, and determining layout features that are prone to lithographic distortions. A representative hotspot in each group can then be identified and stored in a hotspot library for future hotspot detection. As described in detail below, an improved classification approach can advantageously facilitate automatic hotspot correction and diagnosis. Thus, instead of analyzing the failure reason and correcting the hotspots one by one as done conventionally, a representative hotspot in each group can be used to automatically correct the remaining hotspots in the same group, i.e. the representative hotspot is effectively a correction template for the hotspots in the group.

The hotspot classification approach relies on a distance metric of different pattern samples. The distance metric is a quantitative measure of the differences between two pattern samples, wherein a "pattern" as used herein refers to one or more polygons in optical proximity to each other. With the distance metric, the pattern samples which are close to each other are clustered into a group by cluster analysis. Note that as used herein, the term "close" means similar in appearance, and the term "cluster" means a group based on similarity in appearance (not spatial proximity).

Cluster analysis can be generically defined as the classification of objects into groups (also called clusters) so that the objects within the same group are closer to each other than those from different clusters, according to the predefined distance metric. For an ideal distance metric, it should have the ability to capture the sketch of the hotspot pattern and also be tolerant with small variations or shifts of the polygons.

Hierarchical clustering algorithms produce a hierarchical representation of the data objects in which the clusters at each level of the hierarchy are created by merging clusters at the next lower level. The traditional representation of the hierarchy is a tree. At the lowest level of the tree, each cluster contains a single object. At the highest level, there is only one cluster containing all the objects. The tree can be built in two ways: bottom-up or top-down. Bottom-up strategies start at the bottom and at each level recursively merge a selected pair with the smallest inter-distance into a single cluster. Top-down methods start at the top and at each level recursively split one of the existing clusters with the largest intra-distance at that level into two clusters.

After the tree is built, it is still necessary to choose the number of clusters, because it is unknown what number of clusters is most suitable before clustering. The number of clusters can be chosen by quantitatively examining the quality of the clustering. L. Hubert and J. Schulz describe choosing the number of clusters in "Quadratic assignment as a general data-analysis strategy" in Br. Journal of Math. Statist. Psychology, pages 190-241, 1976. The final clustering result is derived such that the objects within the same group are more similar to each other than those from different clusters. Hierarchical clustering can produce nearly ideal clustering result. However, hierarchical clustering requires a pre-computed pair-wise distance matrix of all the objects, which is computationally intensive.

In contrast, incremental clustering method is a heuristic clustering algorithm, in which data objects are sequentially inserted into incrementally evolving clusters. In the incremental clustering algorithm, the cluster is represented using cluster feature (CF). The cluster feature includes the number of objects in the cluster, the central object of the cluster, and the radius of the cluster. A CF-tree can be used to organize the existing clusters. The CF-tree can be viewed as a search tree for incremental clustering to guide the new object to insert into the most appropriate cluster. Thus, the CF-tree can be updated every time a new object has been inserted. The incremental clustering does not require computation of a complete pair-wise distance matrix, and therefore is time and space efficient for clustering large datasets. However, because the data objects are inserted into the CF-tree sequentially, the clustering result is significantly affected by the insertion sequence of the data objects.

From the viewpoint of lithography, the hotspots result from their local surrounding context. A hotspot and its local surrounding context are defined as a "clip". Every pixel of the clip is either light or dark. Thus, if two clips are overlaid, corresponding pixels of the two clips either match (i.e. both are light or both are dark) or differ (if one is light and one is dark). The distance metric $\rho$ can be defined as the square root of the weighted integral over the regions where two clips $\Gamma_1$ and $\Gamma_2$ differ (XOR of two clips), $$\rho(\Gamma_1, \Gamma_2) = \left[ \int \int_{\Gamma_1 \neq \Gamma_2} w(x, y) dA \right]^{\frac{1}{2}} \quad \text{(Eq. 1)}$$

where dA is the difference between clips. The weighting function w(x,y) is derived from the lithographic system to describe the magnitude of the effect of each point (using x and y coordinates) of the clip on the hotspot at the center. Specifically, patterns that are within a certain distance from the hotspot have significant effect on the hotspot, while patterns that are several wavelengths or more away from the hotspot have negligible effect on the hotspot.

To address the rotation and reflection of the clips, the distance metric can be redefined as:

$$\rho'(\Gamma_1, \Gamma_2) = \min_{\tau \in D_8} \rho(\Gamma_1, \tau(\Gamma_2)) \quad \text{(Eq. 2)}$$

where $D_8$ represents the set of eight transformations. The eight transformations are combinations of four rotations (0°, 90°, 180°, 270°) and two mirrors (x mirror, y mirror) (i.e. a horizontal or vertical flip, respectively).

Unfortunately, an XOR based distance metric is quite sensitive to the small variations or shifts of the patterns. For example, FIGS. 1A and 1B illustrates patterns 101 and 102, respectively, wherein pattern 102 is derived by shifting pattern 101 to the right-bottom direction by less than 3.98% of the longest edge length in pattern 101. From the viewpoint of lithography, pattern 102 is similar to pattern 101. Moreover, the difference in distance between pattern 102 and pattern 101 is small. FIG. 1C illustrates the XOR result 103 of patterns 101 and 102 (white showing overlapped patterns and black showing non-overlapped patterns) (note that the 0-1000 is an exemplary distance measurement, e.g. in nm, in an x-y coordinate space). Using equation 1, the distance metric between pattern 101 and pattern 102 is 2.2468.

For comparison, FIGS. 2A and 2B illustrate patterns 201 and 202, respectively, wherein patterns 201 and 202 are completely different (and patterns 201 and 101 are identical). FIG. 2C illustrates the XOR result 203 of patterns 201 and 202. Once again using equation 1, the distance metric between pattern 201 and pattern 202 is 2.1047, which is even smaller than the distance between pattern 101 and pattern 102. This result is counterintuitive based on the similarity of patterns 101 and 102 and the dissimilarity of patterns 201 and 202. The XOR based distance metric does not match human intuition because of its over-sensitivity to small variations or shifts of the shapes. With such a sensitive distance metric, the hotspot detection process will be error-prone and the hotspot classification accuracy will be remarkably low.

In the computer vision community, a well-developed tangent space method has been successfully applied to polygon matching. The tangent space method defines a distance metric of a pair of polygons, which is the $L_2$ (a term denoting 2-dimensional) norm of the difference of the corresponding turning functions of the polygons. In general, the turning function of the polygon measures the angle of the counterclockwise tangent as a function of the normalized arc length (wherein the arc represents the perimeter of the polygon), measured from some reference point of the polygon.

Specifically, the tangent space method uses a turning function $\Theta_A(s)$ to represent a polygon. The turning function $\Theta_A(s)$ of a polygon A gives the angle of the counter-clockwise tangent as a function of the normalized arc length s, measured from some reference point O on the boundary of A. $\Theta_A(s)$ keeps track of the turning that takes place, increasing with left-hand turns and decreasing with right-hand turns.

Figure 2E:
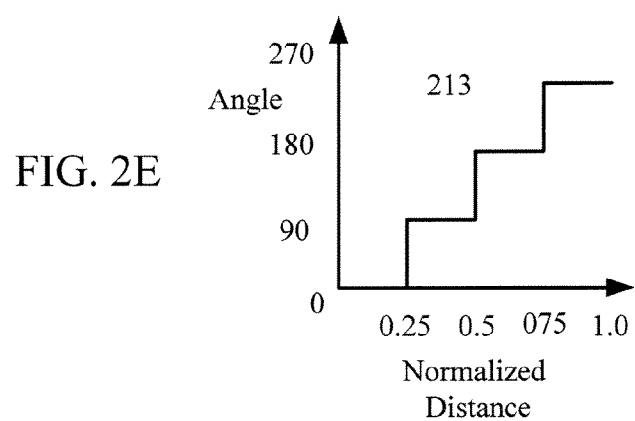

For example, FIGS. 2D and 2E illustrate a turning function 213 for a rectangle 210. Turning function 213 keeps track of the turning that occurs when traversing the perimeter of the polygon (i.e. rectangle 210) in a counter-clockwise way starting from point 211. As shown in FIG. 2E, the tracking begins at the lower-left corner of rectangle 210 at 0 degrees and adds 90 degrees for each corner encountered in its counter-clockwise turning. Three counter-clockwise turns means the last vertex has a 270 angle value.

Figure 2F:
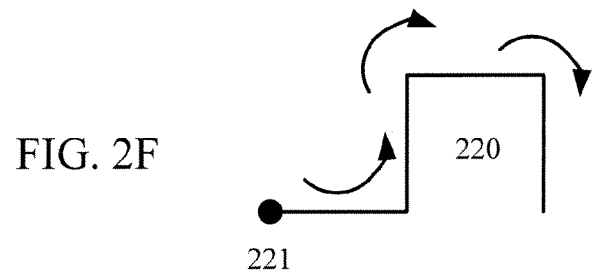
FIGS. 2F and 2G illustrate an exemplary partial polygon and its turning function.
Figure 2G:
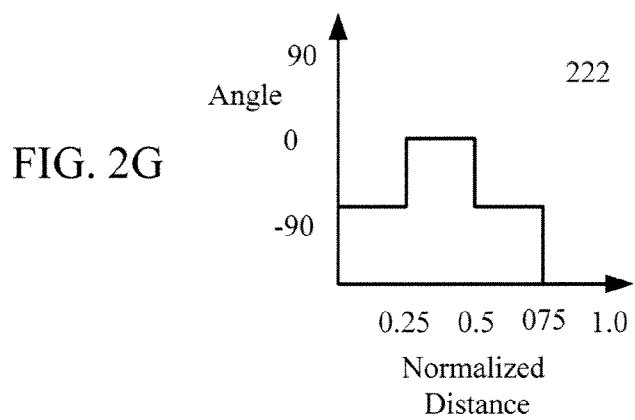

FIGS. 2F and 2G illustrate a turning function 222 for a partial polygon 220. Turning function 222 keeps track of the turning that occurs when traversing the perimeter of the polygon starting from point 221. As shown in FIG. 2G, the tracking turns counter-clockwise, clockwise, and clockwise. Therefore, the angle starts at 0, goes up to 90 degrees, returns to 0, and ends at −90 degrees. Note that the starting vertex is unimportant because the turning function can handle all 8 orientations.

Figure 3A:
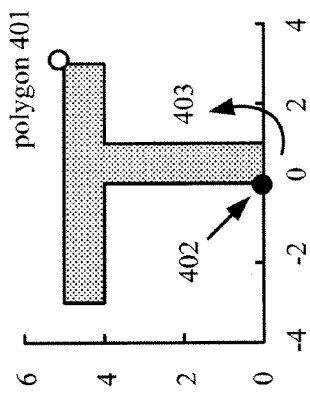
FIGS. 3A and 3B illustrate an exemplary polygon and its turning function.
Figure 4A:
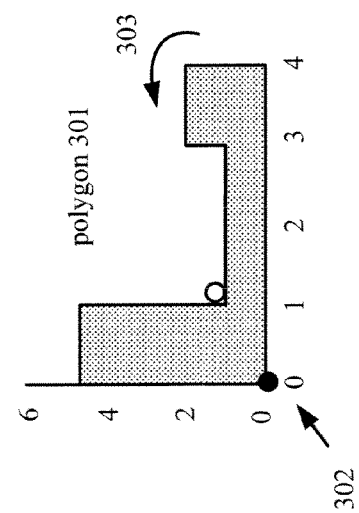
FIGS. 4A and 4B illustrate an exemplary partial polygon and its turning function.
Figure 3B:
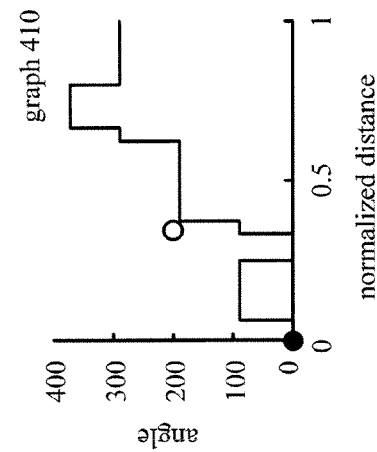
Figure 4B:
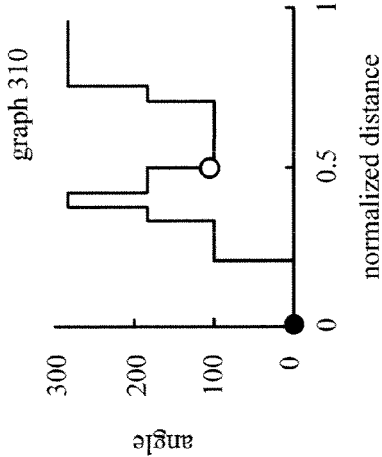

FIG. 3A illustrates an exemplary polygon 301, wherein the reference point is at point 302 (i.e. the left-hand bottom corner of polygon 301) and the turning function proceeds counter-clockwise as shown by arrow 303. FIG. 3B illustrates a graph 310 of the turning function $\Theta_{301}(s)$ of polygon 301 (both point 302 and an intermediate point are shown in FIGS. 3A and 3B to clarify the turning function). FIG. 4A illustrates an exemplary polygon 401, wherein the reference point is at point 402 (i.e. the left-hand bottom corner of polygon 401) and the turning function proceeds counter-clockwise as shown by arrow 403. FIG. 4B illustrates a graph 410 of the turning function $\Theta_{401}(s)$ of polygon 401 (with reference and intermediate points for clarity). Advantageously, a starting vertex to form a turning function will not affect the matching result because the matching compares all 8 transformations in the rectilinear space (rotations and reflections). As a result, the turning function graph is merely started and ended at a different point, which allows easy comparison.

The distance metric for two polygons A and A' based on the tangent space method is defined in equation 3 as the $L_2$ norm of the difference of the corresponding turning functions of the polygons A and A'.

$$d(A, A') = \left( \int_0^1 |\Theta_A(s) - \Theta_{A'}(s)|^2 ds \right)^{\frac{1}{2}}. \quad \text{(Eq. 3)}$$

The distance metric should be insensitive to the rotation of the polygons and the choice of the reference point O. Therefore, the distance metric can be revised as the minimal distance over all the choices of rotations and referenced point as shown in equation 4.

$$d(A, A') = \left( \min_{\Theta \in R, t \in [0,1]} \int_0^1 |\Theta_A(s+t) - \Theta_{A'}(s) + \theta|^2 ds \right)^{\frac{1}{2}} \quad \text{(Eq. 4)}$$

where t represents the shift amount from the reference point O along the boundary of polygon A, θ represents the rotation angle of polygon A, $\Theta_A(s)$ represents a zero turning function of polygon A', and $\Theta_A(s+t)+\theta$ represents the turning function of polygon A with a shift of reference point O by t and rotation by angle θ. An algorithm with complexity O(mn log(mn)) can be used to calculate the minimal distance in equation 4, wherein "m" represents the number of vertices in one polygon and "n" represents the number in the other polygon, as described by D. Huttenlocher et al. in "An efficiently computable metric for comparing polygonal shapes", IEEE Transactions on Pattern Analysis and Machine Intelligence, vol. 13(3):209-216, 1991. As discussed therein, the piecewise-constant characteristic enables easy and fast calculation of the integral in equation 4.

Figure 5A:
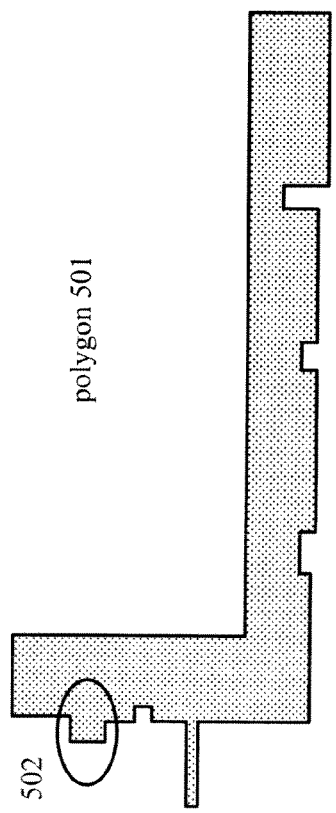
FIGS. 5A and 5B illustrate a polygon before and after a smoothing operation.
Figure 5B:
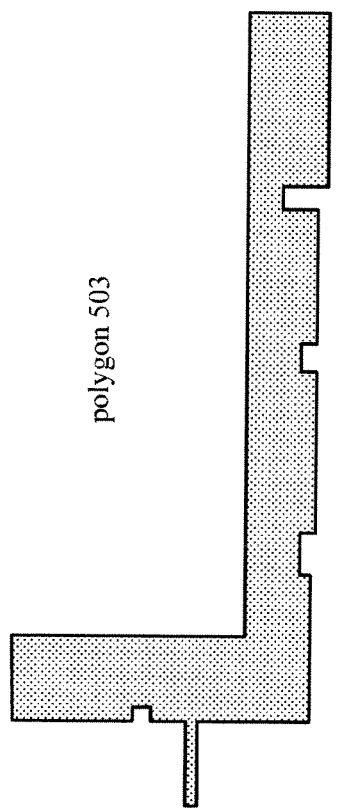

Note that because the perimeter length of the polygon is normalized to 1 for turning function analysis (see, e.g. FIGS. 3B and 4B), any "noise" on the perimeter of the polygon may affect the polygon matching. For example, FIGS. 5A and 5B illustrate two polygons 501 and 503, respectively, wherein polygon 501 has noise introduced by a feature 502. In one embodiment, noise K on the boundary of a polygon can be defined by equation 5:

$$K(s_1, s_2) = \frac{\beta(s_1, s_2)l(s_1)l(s_2)}{l(s_1) + l(s_2)},$$ (Eq. 5)

where $s_1$ and $s_2$ represent two adjacent edges, $l(s_1)$ and $l(s_2)$ represent the length of edge $s_1$ and $s_2$, respectively, and $\beta(s_1, s_2)$ represents the angle between edges $s_1$ and $s_2$. In one embodiment, when the value of noise $K(s_1, s_2)$ is smaller than a predetermined threshold, then the edges $s_1$ and $s_2$ can be regarded as noise and should be eliminated. This elimination method can be applied to bumps and notches in hotspot pattern matching. Notably, eliminating noise on the polygon perimeter (e.g. feature 502 in FIG. 5A) can improve the accuracy of polygon matching.

Thus, the distance metric defined by tangent space method can account for the translation and/or rotation of polygons. Moreover, the tangent space method can deal with noise, e.g. bumps and notches in hotspots, and is fast and easy to compute. However, the conventional tangent space method can only deal with a single polygon, whereas for lithography, the distance metric should deal with hotspot patterns containing multiple polygons.

Figure 6A:
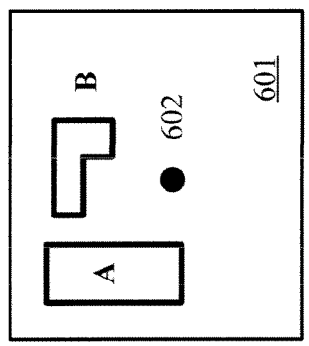
FIGS. 6A, 6B, and 6C illustrate a radial function and an angular function based on an exemplary clip.

For example, FIG. 6A illustrates an exemplary clip 601 that includes polygons A and B. In accordance with the improved tangent space based distance metric, a polar coordinate system for each clip can be defined. An "origin" of the polar coordinate system can be defined as the center of each clip to minimize sensitivity to matching result. In FIG. 6A, an origin 602 can be defined as the center of clip 601.

Figure 6B:
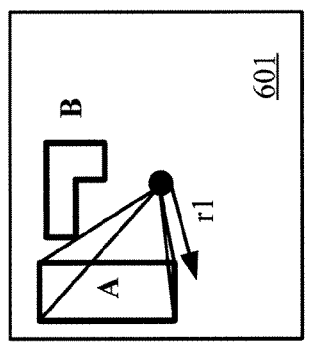
Figure 6C:
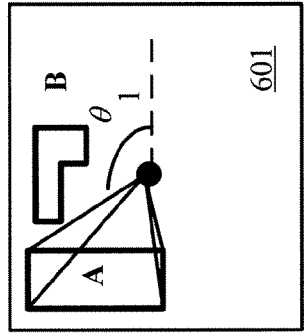
Figure 7B:
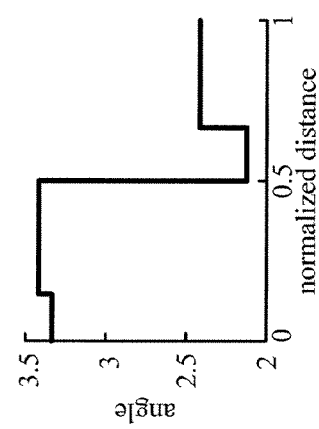
FIGS. 7A and 7B illustrate the radial and angular functions of one polygon of the clip shown in FIG. 6A.
Figure 7D:
FIGS. 7C and 7D illustrate the radial and angular functions of another polygon of the clip shown in FIG. 6A.
Figure 7A:
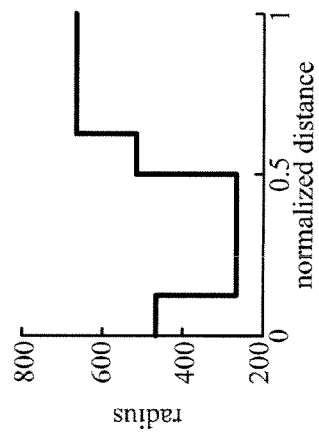
Figure 7C:
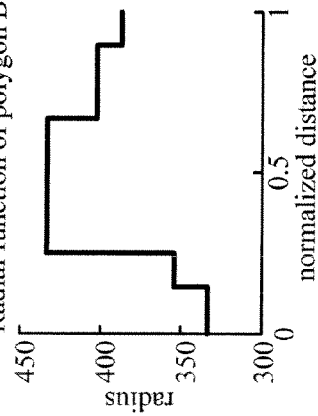

For each polygon in a clip, two functions can be used to describe the polygon: the radial function and the angular function. The radial function gives the radial coordinates of the turning vertices as a function $R_A(s)$ of the normalized polygon edge length s. In one embodiment, the radial function is measured starting at the bottom left point of the polygon, as shown in FIG. 6B for polygon A. The angular function (which is a modified turning function) gives the angular coordinates of the turning vertices as a function $\Theta_A(s)$ of the normalized polygon edge length. FIG. 6C illustrates an exemplary angle of rotation $\theta$ for one turning vertices (a corner) of polygon A. FIGS. 7A and 7B illustrate the radial and angular functions of polygon A (FIG. 6A), whereas FIGS. 7C and 7D illustrate the radial and angular functions of polygon B (FIG. 6A). Note that the radius can be measured using any appropriate scale, e.g. nanometer (nm), whereas the angular function can be measured using degrees.

Based on the definitions of the radial and angular functions, the dual function distance metric of a pair of polygons A and A' (wherein A and A' are similar polygons in different clips) can be defined by:

$$d(A,A') = d_R(A,A') * d_\Theta(A,A'),$$ (Eq. 6)

where $$d_R(A, A') = \left[\int_0^1 w(x, y)|R_A(s) - R_{A'}(s)|^2 \, ds\right]^{\frac{1}{2}},$$

$$d_\Theta(A, A') = \left[\int_0^1 |\Theta_A(s) - \Theta_{A'}(s)|^2 \, ds\right]^{\frac{1}{2}}.$$

wherein w(x,y) is a weighting function (described below) (and can also be used to describe the magnitude of the effect of each point of the clip on the hotspot at the center), $d_R(A,A')$ is the square root of the weighted integral of the difference of the radial functions of polygons A and A' over the normalized edge length s, and $d_\Theta(A, A')$ is the square root of the integral of the difference of the angular functions of polygons A and A'. Note that both the radial function and angular function are piecewise constant functions, and thus the integrals of the radial and angular functions are easy to compute. In one embodiment, noise on the boundary of the polygon can be removed, as described above in reference to FIGS. 5A and 5B.

An exemplary weighting function can be expressed as:

$$\omega(x,y) = \mu(x,y)^2,$$

where $$\mu(x, y) = \mu(r) = 2\frac{J_1(2\pi\sigma r)}{2\pi\sigma r},$$

$J_1$ is the Bessel function of the first kind and first order, $\sigma$ is the partial coherence factor, and r is the distance between the hotspot center and a point on the mask. Note that the partial coherence factor $\sigma$ is defined as:

$$\sigma = \frac{NA_c}{NA_p},$$

where $NA_c$ is the numerical aperture of the condenser lens, and $NA_p$ is the numerical aperture of the objective lens.

To deal with a clip having multiple polygons, a distance metric should be able to capture not only the shapes of the polygons, but also the spacing between the polygons. In the improved tangent space based distance metric, both the absolute position and the shape information of the polygons are encoded into the distance by integrating the differences of radial and angular functions of polygons A and B. Thus, the difference in positions (i.e. spacing) and the difference in shapes of the polygons will both be directly reflected by this distance metric. Therefore, the improved tangent space based distance metric can advantageously analyze clips with multiple polygons therein.

Figure 8A:
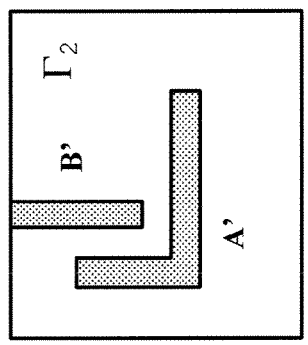
FIGS. 8A and 8B illustrate two clips containing a different number of polygons.
Figure 8B:
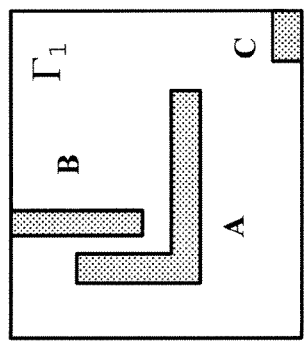

FIGS. 8A and 8B illustrate two clips $\Gamma_1$ and $\Gamma_2$, respectively, each containing multiple polygons. As shown, three differences between clip $\Gamma_1$ and clip $\Gamma_2$ are noted: the differences between polygon A in clip $\Gamma_1$ and polygon A' in clip $\Gamma_2$, the differences between polygon B in clip $\Gamma_1$ and polygon B' in clip $\Gamma_2$, and the differences between polygon C in clip $\Gamma_1$ and a null polygon in clip $\Gamma_2$. In other words, polygons A' and B' in clip $\Gamma_2$ are most similar to polygons A and B in clip $\Gamma_1$, while polygon C in clip $\Gamma_1$ cannot find a matched polygon in clip $\Gamma_2$.

The distance metric defined in equation 6 can be used to determine whether two polygons are matched. If the distance is within a predefined threshold (which can be set based on a technology node or a processing node), then the two polygons are regarded as matched polygons. Otherwise, the two polygons are regarded as unmatched polygons.

The distance of polygon C in clip $\Gamma_1$ and a "null" polygon in clip $\Gamma_2$ can be expressed as:

$$\begin{aligned}\text{distance} \atop \text{(unmatched)} &= d(C, 0) \\ &= d_R(C, 0) * d_\Theta(C, 0) \\ &= \left(\int_0^1 |R_C(s)|^2 ds\right)^{\frac{1}{2}} * \left(\int_0^1 |\Theta_C(s)|^2 ds\right)^{\frac{1}{2}}\end{aligned}$$ (Eq. 7)

As described in further detail below, equation 7 can be used for any unique polygons. In comparing FIGS. 8A and 8B, polygon C is clearly unique. This concept can be extended to polygons that are not similar enough to be matched.

Figure 9B:
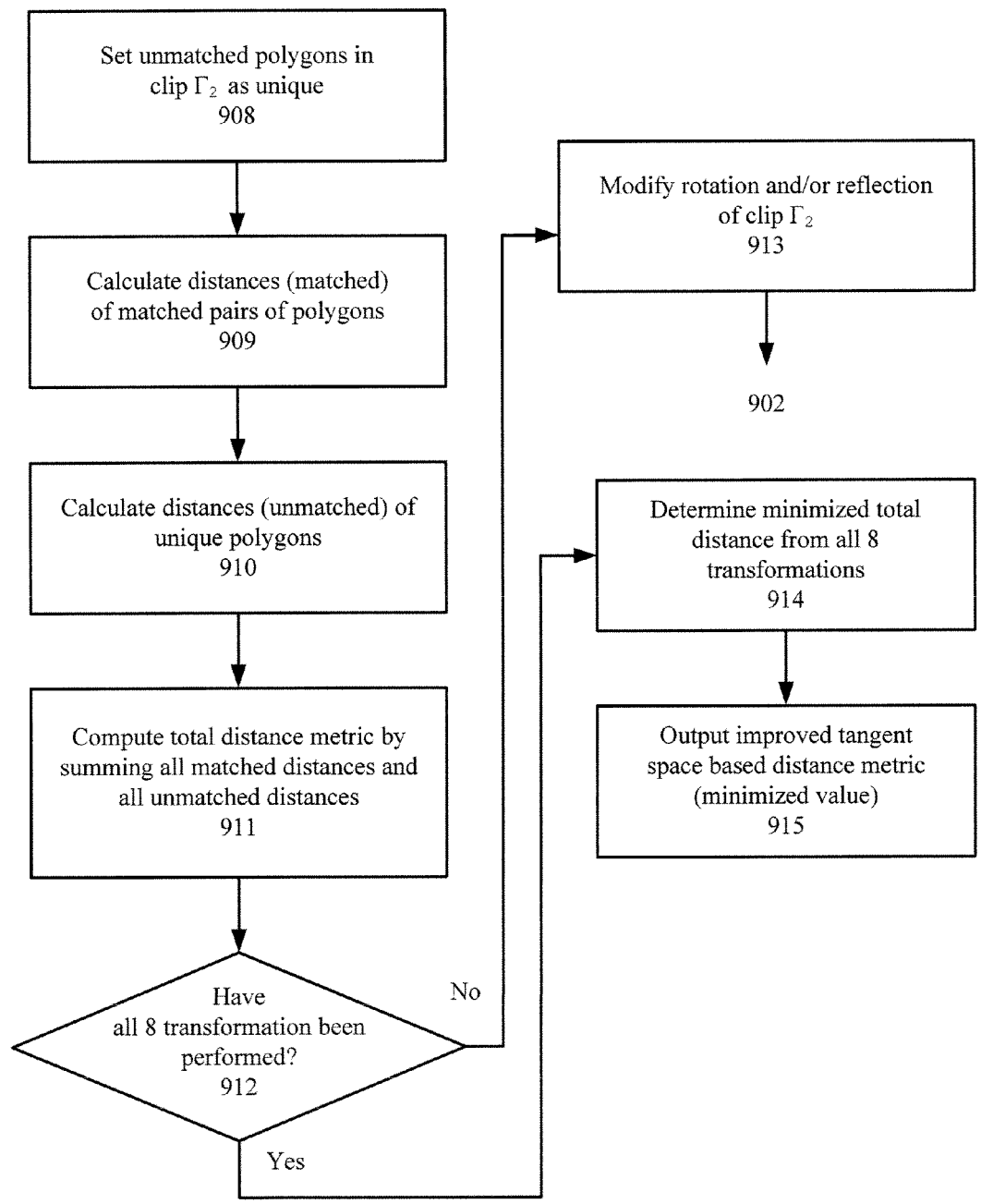

FIGS. 9A and 9B illustrate an exemplary dual function distance metric technique 900 that has clip $\Gamma_1$ and clip $\Gamma_2$ as inputs and generates a distance metric $\rho(\Gamma_1, \Gamma_2)$ as an output. In step 901, the polygons of clips $\Gamma_1$ and $\Gamma_2$ can be identified. For example, $\{p_1, p_2, \ldots, p_m\}$ can be identified as the polygons in clip $\Gamma_1$ and $\{p_1, p_2, \ldots, p_n\}$ can be identified as the polygons in clip $\Gamma_2$. Step 902 can initialize the states of all the polygons in clips $\Gamma_1$ and $\Gamma_2$ as being unmatched. In one embodiment, smoothing can be performed on one or more polygons in step 901A, which is performed before step 903 (e.g. after step 901 or step 902).

In step 903, for an unmatched polygon $p_i$ in clip $\Gamma_1$, find an unmatched polygon $p'_j$ in clip $\Gamma_2$ such that the distance of $p_i$ and $p'_j$, i.e. $d(p_i, p'_j)$, is minimized. That is, for an unmatched polygon in clip $\Gamma_1$, the most similar unmatched polygon in clip $\Gamma_2$ is found. Step 904 determines whether the distance $d(p_i, p'_j)$ between those two polygons is within a predefined threshold. If so, then step 905 sets polygons $p_i$ and $p'_j$ as a matched pair (and sets their states as matched, instead of unmatched). If the distance $d(p_i, p'_j)$ between those two polygons is not within the predefined threshold, then that polygon in clip $\Gamma_1$ is set as unique in step 906. Step 907 determines whether another unmatched polygon is still in clip $\Gamma_1$. If so, then the process returns to step 903. If not (i.e. all polygons in clip $\Gamma_1$ are now set to either matched or unique), then step 908 sets any remaining unmatched polygons in clip $\Gamma_2$ as unique.

At this point, step 909 calculates the distances (distance (matched)) of the matched pairs of polygons, according to equation 6. Step 910 calculates the distances (distance(unmatched)) of the polygons with unique states in clips $\Gamma_1$ and $\Gamma_2$, according to equation 7. Note that in the event that two polygons are not similar enough to be matched, these two polygons are both set to unique. In step 910, the distance for each unique polygon can be computed as if being compared to a null polygon. Step 911 then computes the total distance metric, wherein $$d(\Gamma_1, \Gamma_2) = \Sigma \text{distances(matched)} + \Sigma \text{distances(unmatched)}$$ (Eq. 8).

Step 912 determines whether all 8 transformations have been performed. If not, then step 913 can modify the rotation and/or reflection of clip $\Gamma_2$. At this point, technique 900 can return to step 902 for further processing. After all 8 transformations have been performed, step 914 can determine the minimized total distance from all 8 transformations according to:

$$d'(\Gamma_1, \Gamma_2) = \min_{\tau \in D_8} d(\Gamma_1, \tau(\Gamma_2)),$$ (Eq. 9)

where $D_8$ represents the set of eight transformations (i.e. combinations of four rotations (0°, 90°, 180°, 270°) and two mirrors (x mirror, y mirror)).

Step 915 outputs the minimized total distance from the 8 transformations, i.e., the dual function distance metric. Notably, this dual function distance metric technique 900 is sensitive to the change-of-scale because the distance metric includes the absolute position information of the polygons. Moreover, technique 900 can handle patterns containing multiple polygons, is easy to compute, and can deal with noise. Therefore, the dual function distance metric is a preferred metric for hotspot classification.

Figure 9C:
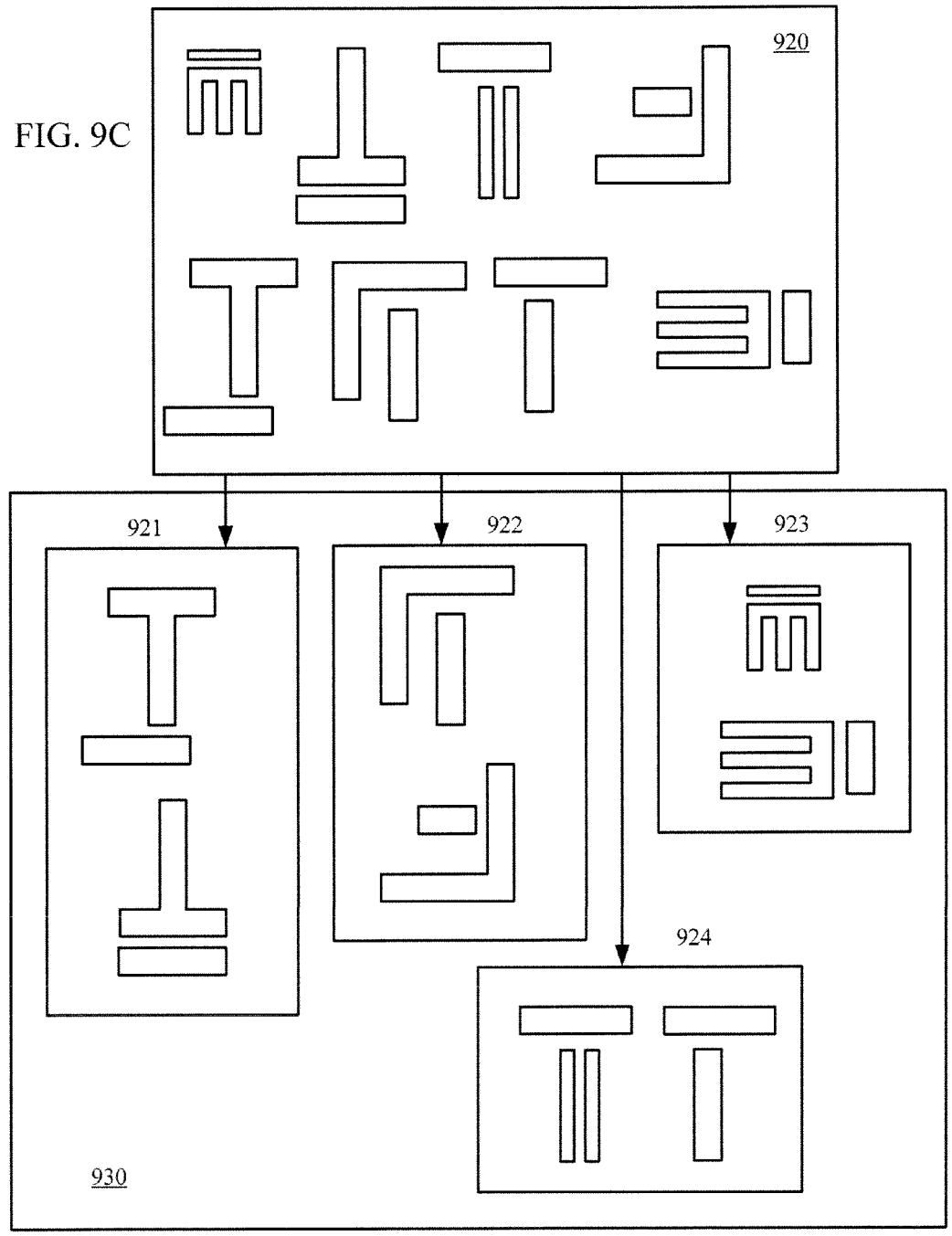
FIG. 9C illustrates an exemplary, initial hotspot library and generated clusters of hotspots using the dual function distance metric technique.

FIG. 9C illustrates an exemplary application of technique 900. In this embodiment, the clips can be part of an initial (unorganized) hotspot library created by test engineers during a process ramp-up at a foundry. An actual initial hotspot library may include thousands of clips that were flagged by the test engineers as being hotspots. Note that the clips in the library may be of different size depending on the technology node (e.g. in one technology node, 200 nm×200 nm up to 500 nm×500 nm) (although typically square, clips can also be rectangular). For simplicity, FIG. 9C illustrates a library 920 that includes 8 clip types.

Figures 1, 9D:
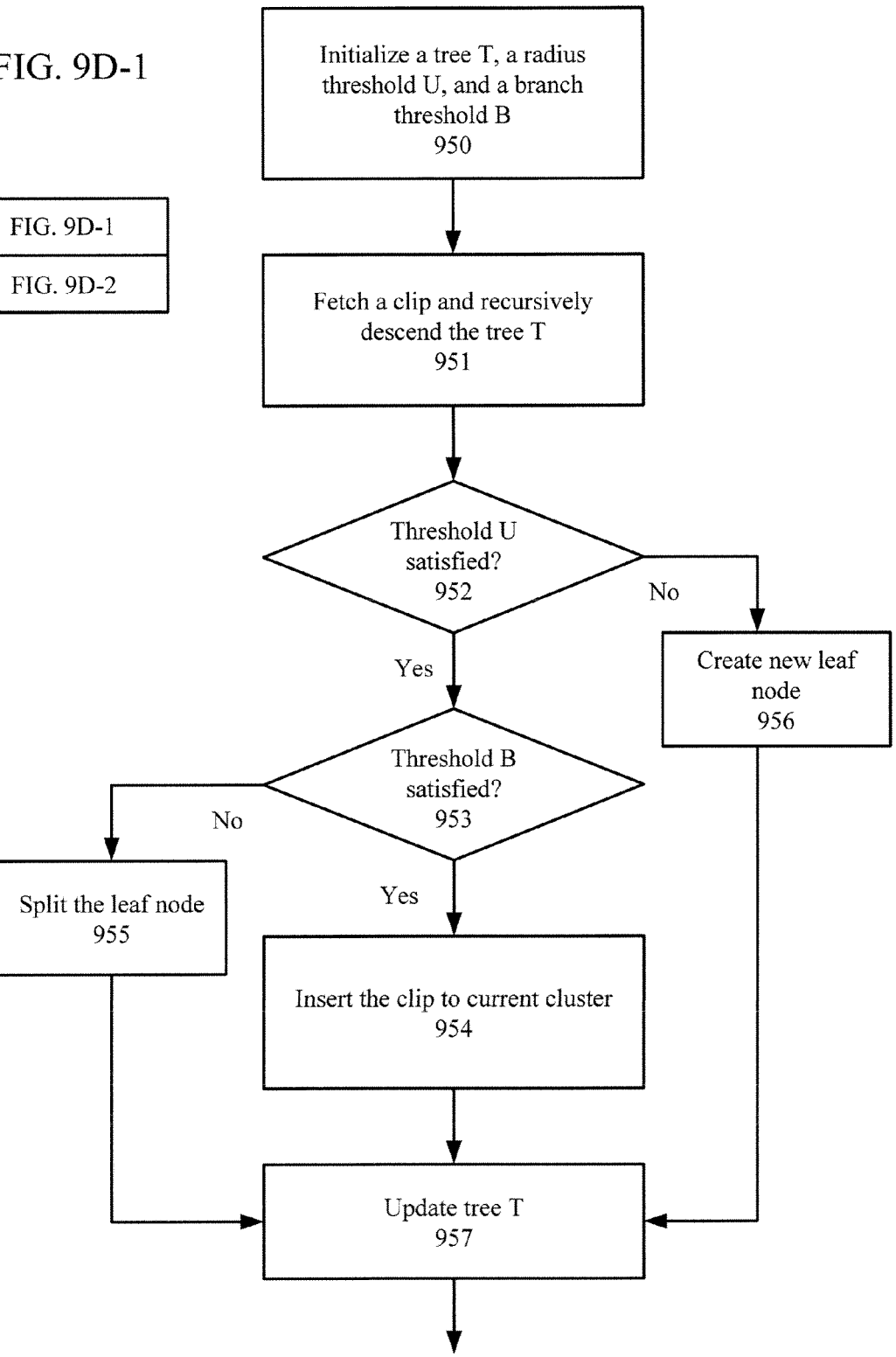
FIGS. 9D-1 and 9D-2 illustrate an exemplary incremental clustering technique that can be used with the dual function distance metric technique.
Figures 2, 9D:
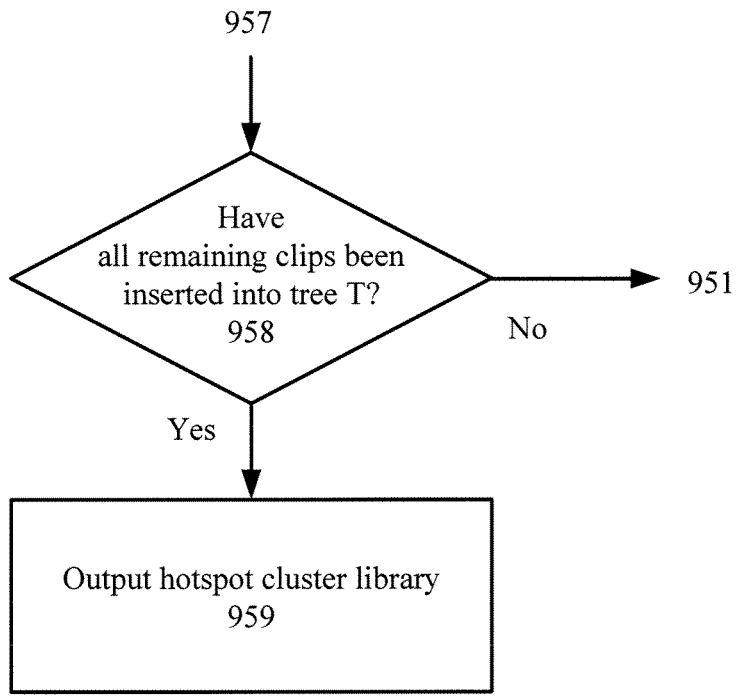

Note that after computing the dual function distance metric for multiple clips, the clustering function itself can be performed using standard techniques. For example, FIGS. 9D-1 and 9D-2 illustrate an exemplary incremental clustering technique. Step 950 can initialize a tree T, a radius threshold U, and a branch threshold B. Step 951 can fetch a clip and recursively descend the tree T. In one embodiment, the tree can guide the input clip to find the closest cluster using the dual function distance metric described above. If the radius threshold U is satisfied in step 952, then step 953 determines whether the branch threshold B is also satisfied. This branch threshold determines whether there exists space in the current cluster. If both the branch threshold B is satisfied, then step 954 can insert the clip into the current cluster and step 957 can update the tree T. If the radius threshold U is not satisfied, then step 956 can create a new leaf node (i.e. create a new cluster), and the technique proceeds to step 957. On the other hand, if the branch threshold B is not satisfied, then step 955 can split the current leaf node (i.e. split the current cluster), and the technique proceeds to step 957. Step 958 can determine whether all remaining clips have been inserted into the tree T. If not, then the technique can return to step 951. If all remaining clips have been inserted into the tree T, then step 959 can output the hotspot cluster library. This incremental clustering approach is described in further detail by Venkatesh Ganti et al. in "Clustering large datasets in arbitrary metric spaces", Proceedings of the 15th International Conference on Data Engineering, pages 502-511, 1999.

Figure 9E:
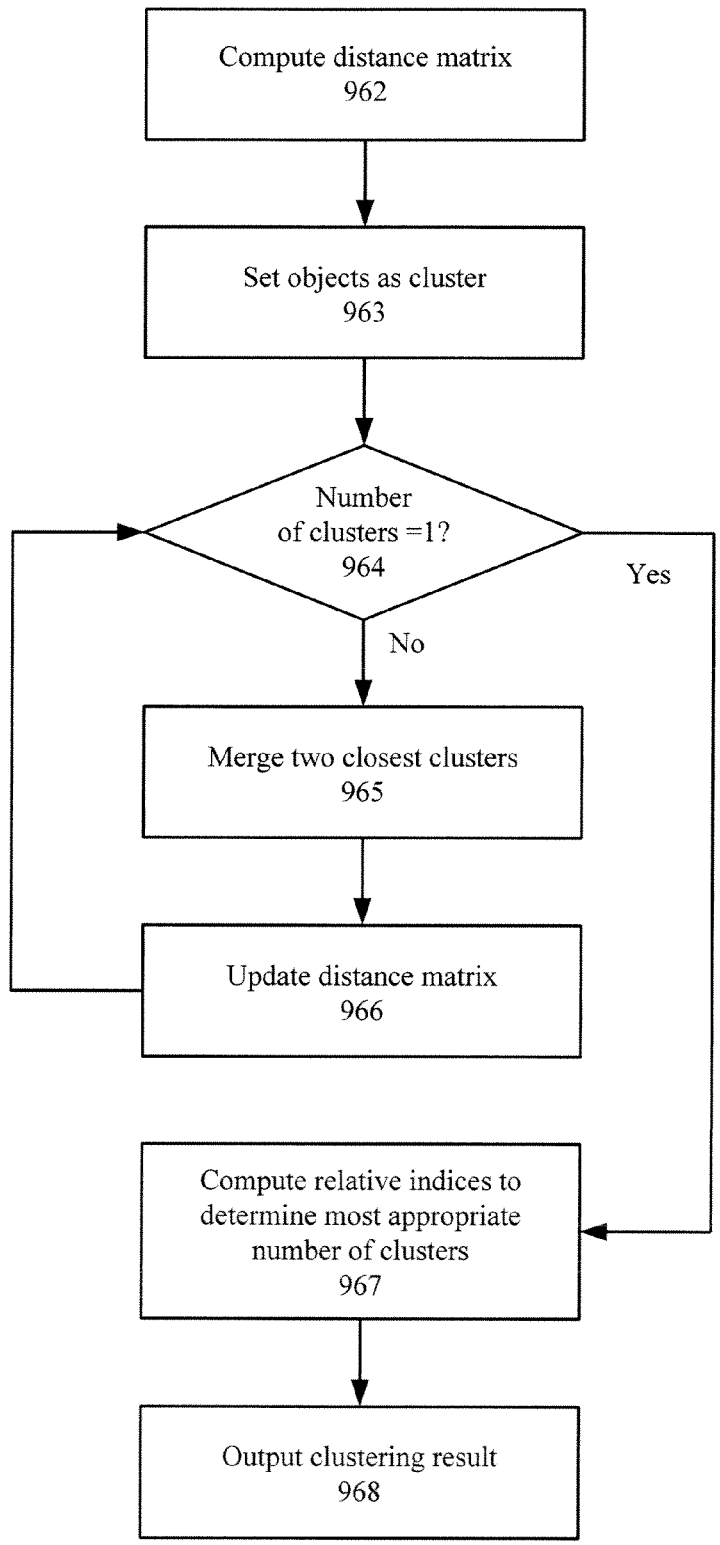
FIG. 9E illustrates an exemplary hierarchical clustering technique that can be used with the dual function distance metric technique.

FIG. 9E illustrates an exemplary hierarchical clustering technique. Step 962 can compute the distance matrix, i.e. an n*n square matrix, where n is the number of clips. Step 963 can set each clip as a cluster, which means initially there are n clusters and each cluster contains a single clip. Step 964 can determine whether the number of clusters equals one (note that the final condition is that all the objects are contained in one cluster). If not, then step 965 can merge the two closest clusters.

At this point, step 966 can update the distance matrix. Specifically, the smallest entry e(i,j) in the matrix can be found, and the corresponding entries in row i and row j can be compared. The smaller one is put into row i, and row j is removed. Then, the corresponding entries in column i and column j can be compared. The smaller one is put into column i, and column j is removed. After updating the distance matrix, the technique can return to step 964.

If the number of clusters equals one in step 967, then step 967 can calculate relative indices, such as a C_index and point_bi-serial, which are used to evaluate the clustering quality. Clustering quality is based on clustering conditions corresponding to different number of clusters. Step 967 calculates the relative indices, which can determine the most appropriate number of clusters. At this point, step 968 can divide the single cluster into the most appropriate number of clusters and then output the clustering result. This hierarchical clustering technique is described in further detail by S.C. Johnson, in "Hierarchical clustering schemes", Psychometrika, pages 241-254, 1967.

Referring back to FIG. 9C, the above-described clustering (or another other known clustering technique) using the dual function distance metric can advantageously generate four clusters 921, 922, 923, and 924 from initial library 920. Clusters 921, 922, 923, and 924 can be stored in a hotspot cluster library 930. Each of clusters 921-924 has similar clips/hotspots that can now be addressed similarly. Note that in an actual initial hotspot library, using the dual function distance metric in clustering may reduce the library from 1000 or more patterns to 50 patterns, thereby dramatically reducing turn around time and thus increasing the efficiency of the foundry. For example, one cluster may necessitate a new design rule change (DRC) to prevent that pattern from being used at that technology node. Another cluster may be addressed using model-based OPC to yield an appropriate layout correction for the foundry recipe. Yet another cluster may be addressed using rule-based OPC to yield an appropriate layout correction for the foundry recipe.

Figure 10A:
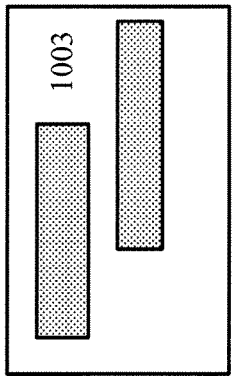
FIGS. 10A, 10B, and 10C illustrate three clips.
Figure 10B:
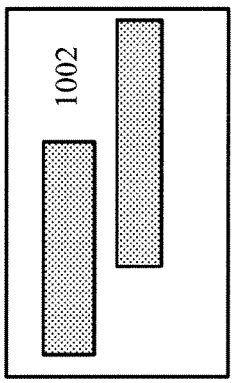
Figure 10C:
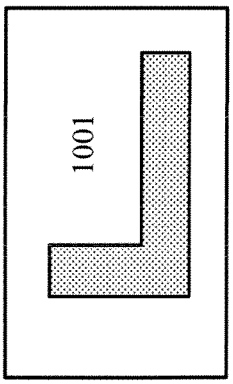

The dual function distance metric also exhibits greater sensitivity to noise compared to the conventional XOR distance metric. In one embodiment, "sensitivity" refers to how responsive the computation results are to shifts and bumps. For example, FIGS. 10A, 10B, and 10C illustrate three clips: clip 1001 (FIG. 10A) has one polygon, clip 1002 (FIG. 10B) has two polygons, and clip 1003 (FIG. 10C) has two polygons that are identical to those of clip 1002, but shifted by 3.98% to the right. TABLES 1 and 2 below show the distance calculated by the XOR metric and the improved tangent space based distance metric, respectively, for clips 1001, 1002, and 1003.

As shown in TABLE 1, the distance between clips 1002 and 1003 is approximately the same as the distance between clips 1001 and 1002 for the XOR based distance metric. However, as shown in TABLE 2, the distance between clips 1002 and 1003 is only one seventh of the distance between clips 1001 and 1002 for the improved tangent space based metric, which matches the intuition of lithography. As noted by these computations, the smaller the distance, the greater the similarity between the clips. In contrast, the larger the distance, the less similar the clips are. Thus, TABLES 1 and 2 show that the improved tangent space based distance metric is significantly more sensitive to shifts than the XOR based distance metric.

TABLE 1

Distance matrix by XOR metric for clips shown in FIGS. 10A, 10B, and 10C.

|  | clip 1001 | clip 1002 | clip 1003 |
|---|---|---|---|
| clip 1001 | 0 | 2.1942 | 2.2066 |
| clip 1002 | 2.1942 | 0 | 2.2943 |
| clip 1003 | 2.2066 | 2.2943 | 0 |

TABLE 2

Distance matrix by dual function distance metric for clips shown in FIGS. 10A, 10B, and 10C.

|  | clip 1001 | clip 1002 | clip 1003 |
|---|---|---|---|
| clip #1 | 0 | 2.581 | 1.932 |
| clip #2 | 2.581 | 0 | 0.322 |
| clip #3 | 1.932 | 0.322 | 0 |

Figure 11A:
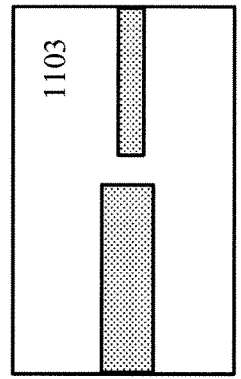
FIGS. 11A, 11B, and 11C illustrate three clips.
Figure 11B:
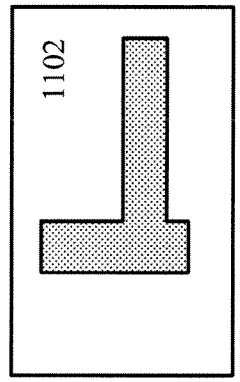
Figure 11C:
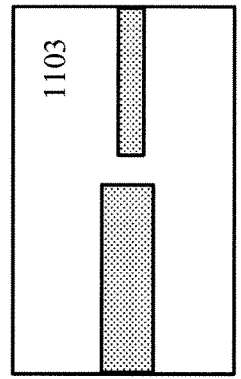

The improved tangent space based distance metric is also significantly more sensitive to bumps than the XOR based distance metric. For example, FIGS. 11A, 11B, and 11C illustrate clips 1101, 1102, and 1103, respectively. Clip 1101 has only one "L" shape, clip 1102 has a small bump (lower left corner) compared to clip 1101, and clip 1103 has two rectangles positioned end to end. From the viewpoint of lithography, clips 1101 and 1102 should be clustered into the same group, whereas clip 1103 should be in a different cluster. TABLES 3 and 4 below show the distance calculated by the XOR distance metric and the improved tangent space based distance metric, respectively, for clips 1101, 1102, and 1103.

As shown in TABLE 3, the distance between clips 1101 and 1102 is remarkably large using the XOR based distance metric, particularly when comparing it to the computed distances between clip 1103 and either of clips 1102 or 1101. Indeed, the computed distances of TABLE 3 are counter-intuitive. However, as shown in TABLE 4, the inter-cluster distance is about 20× of the intra-cluster distance, thereby showing that the improved tangent space based distance metric can accurately distinguish clips of different clusters.

TABLE 3

Distance matrix using XOR distance metric for clips shown in FIGS. 11A, 11B, and 11C

|  | clip #1 | clip #2 | clip #3 |
|---|---|---|---|
| clip #1 | 0 | 2.241 | 2.585 |
| clip #2 | 2.241 | 0 | 2.622 |
| clip #3 | 2.585 | 2.622 | 0 |

TABLE 4

Distance matrix using dual function distance metric for clips shown in FIGS. 11A, 11B, and 11C

|  | clip #1 | clip #2 | clip #3 |
|---|---|---|---|
| clip #1 | 0 | 0.242 | 5.759 |
| clip #2 | 0.242 | 0 | 6.491 |
| clip #3 | 5.759 | 6.491 | 0 |

TABLE 5 indicates the results of various industrial test cases having different types and numbers of patterns using the dual function distance metric and the XOR distance metric. The effects of using different hierarchical clustering and incremental clustering algorithms are also shown in TABLE 5. As shown in TABLE 5, irrespective of the cluster algorithm used, the improved tangent space based distance metric has significantly better accuracy than the XOR distance metric with somewhat slower clustering speed.

TABLE 5: Comparison of accuracy and speed with different clustering algorithms (hierarchical clustering, incremental clustering algorithms) and different distance metrics (XOR based and ITS based distance metrics)

| cases | # patterns | xor + hier | | xor + incr | | its + hier | | its + incr | |
|---|---|---|---|---|---|---|---|---|---|
| | | accu | time(s) | accu | time(s) | accu | time(s) | accu | time(s) |
| C1_40 | 40 | 1 | 3.54 | 1 | 2.99 | 1 | 10.11 | 1 | 5.53 |
| C2_40 | 40 | 1 | 3.79 | 1 | 2.40 | 1 | 10.01 | 1 | 4.07 |
| C3_40 | 40 | 1 | 2.89 | 1 | 2.07 | 1 | 7.52 | 1 | 4.52 |
| C4_80 | 80 | 1 | 11.78 | 0.75 | 5.39 | 1 | 33.32 | 1 | 12.34 |
| C5_70 | 70 | 0.8571 | 10.39 | 1 | 5.74 | 1 | 24.66 | 1 | 11.33 |
| C6_80 | 80 | 0.875 | 12.14 | 0.9875 | 5.73 | 1 | 38.08 | 1 | 14.63 |
| C7_80 | 80 | 1 | 12.37 | 1 | 6.68 | 1 | 36.16 | 1 | 14.76 |
| C8_80 | 80 | 1 | 13.06 | 1 | 5.68 | 1 | 39.23 | 1 | 14.60 |
| C9_80 | 80 | 1 | 11.72 | 1 | 5.62 | 1 | 31.98 | 1 | 11.40 |
| C10_80 | 80 | 0.625 | 10.86 | 0.625 | 6.38 | 1 | 32.25 | 1 | 13.12 |
| C11_80 | 80 | 0.75 | 13.24 | 0.9125 | 5.99 | 1 | 37.53 | 1 | 13.32 |
| C12_80 | 80 | 0.8125 | 13.12 | 0.625 | 5.30 | 1 | 37.12 | 1 | 13.63 |
| C13_160 | 160 | 0.75 | 47.00 | 1 | 15.16 | 1 | 145.66 | 1 | 49.12 |
| C14_320 | 320 | 1 | 189.57 | 1 | 41.09 | 1 | 591.37 | 1 | 153.05 |
| C15_640 | 640 | 0.625 | 630.57 | 0.6625 | 115.54 | 1 | 2028.50 | 0.875 | 495.30 |
| C16_1280 | 1280 | 0.625 | 2572.22 | 0.5625 | 536.86 | 1 | 7911.77 | 0.8125 | 2249.74 |
| average | / | 0.8699 | / | 0.8828 | / | 1 | / | 0.9847 | / |
| worst | / | 0.625 | / | 0.5625 | / | 1 | / | 0.8125 | / | wherein "xor" means the XOR distance metric, "its" means the improved tangent space based distance metric, "hier" means the hierarchical clustering method, and "incr" means the incremental clustering method. Each pattern was checked and manually assigned a classification label from the viewpoint of lithography. These patterns were then classified by the above-described cluster analysis methods. For a pattern, if the classification label obtained by cluster analysis matches the manually assigned one, the clustering result is "correct" for this pattern. The accuracy is defined as the number of the correctly classified patterns over the total number of patterns.

As shown in TABLE 5, the dual function distance metric can achieve nearly ideal accuracy for all the test cases except the C15_640 and C16_1280 cases. The degeneracy of the accuracy of the cases C15_640 and C16_1280 for this metric is mainly due to the limitation of incremental clustering method, which is sensitive to the sequence of data input. Nevertheless, the accuracy of the cases C15_640 and C16_1280 for ITS metric based incremental clustering method is still acceptable. On the other hand, the accuracy of XOR metric based clustering methods is remarkably lower for some test cases. Statistically, the CPU time for computing an improved tangent space based distance metric is about 2×-4× that for computing an XOR distance metric. However, the dual function distance metric is more reliable and accurate for hotspot classification and therefore is more suitable than the XOR distance metric for industry applications.

Figure 12:
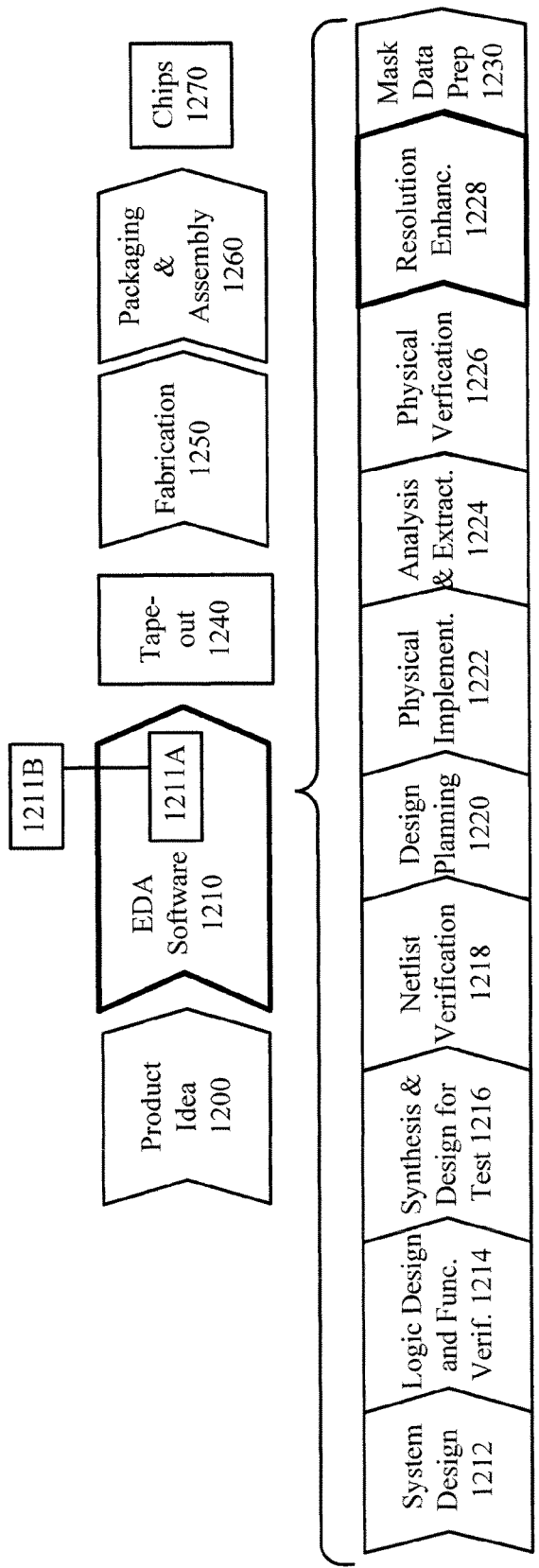
FIG. 12 shows a simplified representation of an exemplary digital ASIC design flow.

FIG. 12 shows a simplified representation of an exemplary digital ASIC design flow that can use the above-described dual function distance metric technique. At a high level, the process starts with the product idea (step 1200) and is realized in an EDA software design process (step 1210). When the design is finalized, it can be taped-out (event 1240). After tape out, the fabrication process (step 1250) and packaging and assembly processes (step 1260) occur resulting, ultimately, in finished chips (result 1270).

The EDA software design process (step 1210) is actually composed of a number of steps 1212-1230, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components/steps of the EDA software design process (step 1210) will now be provided. In one embodiment, one or more steps of the EDA software design process can be implemented using a non-transitory computer-readable medium 1211A, which is read by a computer 1211B. Note that Astro, AstroRail, CustomSim, ESP, Hercules, IC Compiler, Magellan, Model Architect, Power Compiler, PrimeRail, Proteus, ProteusAF, PSMGen, Saber, StarRC, and System Studio are trademarks of Synopsys, Inc., and CATS, DesignWare, Design Compiler, Formality, HSIM, Leda, NanoSim, Primetime, Syndicated, TetraMAX, VCS, and Vera are registered trademarks of Synopsys, Inc. System design (step 1212): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect™, Saber™, System Studio™, and DesignWare® products.

Logic design and functional verification (step 1214): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include HSIM®, NanoSim®, CustomSim™, VCS®, VERA®, DesignWare®, Magellan™, Formality®, ESP™ and LEDA® products.

Synthesis and design for test (step 1216): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler™, Tetramax®, and DesignWare® products.

Netlist verification (step 1218): At this step, the netlist is checked for compliance with timing constraints and for correspondence with the VHDL/Verilog source code. Exemplary EDA software products from Synopsys, Inc. that can be used at this step include Formality®, PrimeTime™, and VCS® products.

Design planning (step 1220): Here, an overall floorplan for the chip is constructed and analyzed for timing and top-level routing. Exemplary EDA software products from Synopsys, Inc. that can be used at this step include Astro™ and IC Compiler™ products.

Physical implementation (step 1222): The placement (positioning of circuit elements) and routing (connection of the same) occurs at this step. Exemplary EDA software products from Synopsys, Inc. that can be used at this step include the Astro™ and IC Compiler™ products.

Analysis and extraction (step 1224): At this step, the circuit function is verified at a transistor level, this in turn permits what-if refinement. Exemplary EDA software products from Synopsys, Inc. that can be used at this step include Astro-Rail™, PrimeRail™, Primetime®, and Star RC/XT™ products.

Physical verification (step 1226): At this step various checking functions are performed to ensure correctness for: manufacturing, electrical issues, lithographic issues, and circuitry. Exemplary EDA software products from Synopsys, Inc. that can be used at this step include the Hercules™ product.

Resolution enhancement (step 1228): This step involves geometric manipulations of the layout to improve manufacturability of the design. Exemplary EDA software products from Synopsys, Inc. that can be used at this step include Proteus™, ProteusAF™, and PSMGen™ products. In one embodiment, the dual function distance metric technique can be used for characterizing and/or clustering of clips in step 1228.

Mask data preparation (step 1230): This step provides the "tape-out" data for production of masks for lithographic use to produce finished chips. Exemplary EDA software products from Synopsys, Inc. that can be used at this step include the CATS® family of products.

As described above, the computation of the improved tangent space based distance metric and the clustering can be implemented in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of nonvolatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

Although illustrative embodiments of the invention have been described in detail herein with reference to the accompanying figures, it is to be understood that the invention is not limited to those precise embodiments. For example, although the dual function distance metric is described above for use in hotspot clustering, this metric can also be used in hotspot detection. Thus, the scope of the invention is defined by the following Claims and their equivalents.

The invention claimed is:

1. A method of characterizing a plurality of clips of an integrated circuit layout for clustering, at least one clip including multiple polygons, the method comprising:
   (a) identifying polygons of a first clip and a second clip;
   (b) initializing states of all polygons in the first and second clips as unmatched;
   (c) for a first unmatched polygon in the first clip, finding a second unmatched polygon in the second clip where a distance metric between the first and second unmatched polygons is minimized, the distance metric being computed using a processor by integrating differences of radial and angular functions of the first unmatched polygon in the first clip and the second unmatched polygon in the second clip, the distance metric providing a quantitative measure of similarity;
   (d) when the distance metric is less than a predefined threshold, setting the first and second unmatched polygons as a matched pair, and setting states of the first and second unmatched polygons as matched;
   (e) when the distance metric is not less than the predefined threshold, setting the state of the first unmatched polygon as unique;
   (f) repeating steps (c), (d), and (e) for each remaining unmatched polygon in the first clip;
   (g) calculating matched distances for all matched pairs;
   (h) calculating unmatched distances for all unique polygons;
   (i) computing a total distance for the first and second clips by summing all matched distances and all unmatched distances;
   (j) repeating steps (b)-(i) for each of eight transformations of the first clip, a transformation being a reflection or a rotation of the first clip; and
   (k) determining a minimized total distance metric from the eight transformations, wherein the minimized total distance determines whether the first and second clips should be clustered,
   wherein the method is performed by a computer.

2. The method of claim 1, wherein the integrating differences of the radial function of the first unmatched polygon in the first clip and the second unmatched polygon in the second clip includes computing:

$$d_R(A, A') = \left[ \int_0^1 w(x, y) |R_A(s) - R_{A'}(s)|^2 \, ds \right]^{\frac{1}{2}},$$

where $w(x, y)$ is a weighting function and $R(s)$ is radial function of a normalized edge length for each of the first unmatched polygon (A) and the second unmatched polygon (A').

3. The method of claim 1, wherein the integrating differences of the angular function of the first unmatched polygon in the first clip and the second unmatched polygon in the second clip includes computing:

$$d_\Theta(A, A') = \left[\int_0^1 |\Theta_A(s) - \Theta_{A'}(s)|^2 \, ds\right]^{\frac{1}{2}},$$

where the angular function gives angular coordinates of turning vertices as a function $\Theta(s)$ of a normalized polygon edge length s for each of the first unmatched polygon (A) and the second unmatched polygon (A').

4. The method of claim 1, wherein calculating unmatched distances for all unique polygons includes computing $$\left(\int_0^1 |R_C(s)|^2 ds\right)^{\frac{1}{2}} * \left(\int_0^1 |\Theta_C(s)|^2 ds\right)^{\frac{1}{2}},$$

where R(s) is the radial function over a normalized polygon edge length s for a unique polygon (C) and $\Theta(s)$ is the angular function of the normalized polygon edge length s for the unique polygon (C).

5. The method of claim 1, further including forming a distance matrix of a plurality of minimized total distance metrics corresponding to a plurality of clips.

6. The method of claim 1, wherein the eight transformations include rotating the first clip by 0, 90, 180, or 270 degrees and providing an x or y mirror.

7. The method of claim 1, further including smoothing an edge of at least one of the first and second unmatched polygons.

8. A non-transitory, computer-readable medium storing computer-executable instructions for characterizing a plurality of clips of an integrated circuit layout for clustering, at least one clip including multiple polygons, the computer-executable instructions when executed by a processor performing steps comprising:
   (a) identifying polygons of a first clip and a second clip;
   (b) initializing states of all polygons in the first and second clips as unmatched;
   (c) for a first unmatched polygon in the first clip, finding a second unmatched polygon in the second clip where a distance metric between the first and second unmatched polygons is minimized, the distance metric being computed by integrating differences of radial and angular functions of the first unmatched polygon in the first clip and the second unmatched polygon in the second clip, the distance metric providing a quantitative measure of similarity;
   (d) when the distance metric is less than a predefined threshold, setting the first and second unmatched polygons as a matched pair, and setting states of the first and second unmatched polygons as matched;
   (e) when the distance metric is not less than the predefined threshold, setting the state of the first unmatched polygon as unique;
   (f) repeating steps (c), (d), and (e) for each remaining unmatched polygon in the first clip;
   (g) calculating matched distances for all matched pairs;
   (h) calculating unmatched distances for all unique polygons;
   (i) computing a total distance for the first and second clips by summing all matched distances and all unmatched distances;
   (j) repeating steps (b)-(i) for each of eight transformations of the first clip, a transformation being a reflection or a rotation of the first clip; and
   (k) determining a minimized total distance metric from the eight transformations, wherein the minimized total distance determines whether the first and second clips should be clustered.

9. The computer-readable medium of claim 8, wherein the integrating differences of the radial function of the first unmatched polygon in the first clip and the second unmatched polygon in the second clip includes computing:

$$d_R(A, A') = \left[\int_0^1 w(x, y)|R_A(s) - R_{A'}(s)|^2 \, ds\right]^{\frac{1}{2}},$$

where w(x, y) is a weighting function and R(s) is radial function of a normalized edge length for each of the first unmatched polygon (A) and the second unmatched polygon (A').

10. The computer-readable medium of claim 8, wherein the integrating differences of the angular function of the first unmatched polygon in the first clip and the second unmatched polygon in the second clip includes computing:

$$d_\Theta(A, A') = \left[\int_0^1 |\Theta_A(s) - \Theta_{A'}(s)|^2 \, ds\right]^{\frac{1}{2}},$$

where the angular function gives angular coordinates of turning vertices as a function $\Theta(s)$ of a normalized polygon edge length s for each of the first unmatched polygon (A) and the second unmatched polygon (A').

11. The computer-readable medium of claim 8, wherein calculating unmatched distances for all unique polygons includes computing $$\left(\int_0^1 |R_C(s)|^2 ds\right)^{\frac{1}{2}} * \left(\int_0^1 |\Theta_C(s)|^2 ds\right)^{\frac{1}{2}},$$

where R(s) is the radial function over a normalized polygon edge length s for a unique polygon (C) and $\Theta(s)$ is the angular function of the normalized polygon edge length s for the unique polygon (C).

12. The computer-readable medium of claim 8, further including forming a distance matrix of a plurality of minimized total distance metrics corresponding to a plurality of clips.

13. The computer-readable medium of claim 8, wherein the eight transformations include rotating the first clip by 0, 90, 180, or 270 degrees and providing an x or y mirror.

14. The computer-readable medium of claim 8, further including smoothing an edge of at least one of the first and second unmatched polygons.

15. A processor configured to characterize a plurality of clips of an integrated circuit layout for clustering, at least one clip including multiple polygons, the processor configured to execute instructions for performing steps comprising:
   (a) identifying polygons of a first clip and a second clip;
   (b) initializing states of all polygons in the first and second clips as unmatched;
   (c) for a first unmatched polygon in the first clip, finding a second unmatched polygon in the second clip where a distance metric between the first and second unmatched polygons is minimized, the distance metric being computed by integrating differences of radial and angular functions of the first unmatched polygon in the first clip and the second unmatched polygon in the second clip, the distance metric providing a quantitative measure of similarity;
(d) when the distance metric is less than a predefined threshold, setting the first and second unmatched polygons as a matched pair, and setting states of the first and second unmatched polygons as matched;
(e) when the distance metric is not less than the predefined threshold, setting the state of the first unmatched polygon as unique;
(f) repeating steps (c), (d), and (e) for each remaining unmatched polygon in the first clip;
(g) calculating matched distances for all matched pairs;
(h) calculating unmatched distances for all unique polygons;
(i) computing a total distance for the first and second clips by summing all matched distances and all unmatched distances;
(j) repeating steps (b)-(i) for each of eight transformations of the first clip, a transformation being a reflection or a rotation of the first clip; and
(k) determining a minimized total distance metric from the eight transformations, wherein the minimized total distance determines whether the first and second clips should be clustered.

16. The processor of claim 15, wherein the integrating differences of the radial function of the first unmatched polygon in the first clip and the second unmatched polygon in the second clip includes computing:

$$d_R(A, A') = \left[ \int_0^1 w(x, y) |R_A(s) - R_{A'}(s)|^2 \, ds \right]^{\frac{1}{2}},$$

where $w(x, y)$ is a weighting function and $R(s)$ is radial function of a normalized edge length for each of the first unmatched polygon (A) and the second unmatched polygon (A').

17. The processor of claim 15, wherein the integrating differences of the angular function of the first unmatched polygon in the first clip and the second unmatched polygon in the second clip includes computing:

$$d_\Theta(A, A') = \left[ \int_0^1 |\Theta_A(s) - \Theta_{A'}(s)|^2 \, ds \right]^{\frac{1}{2}},$$

where the angular function gives angular coordinates of turning vertices as a function $\Theta(s)$ of a normalized polygon edge length s for each of the first unmatched polygon (A) and the second unmatched polygon (A').

18. The processor of claim 15, wherein calculating unmatched distances for all unique polygons includes computing $$\left( \int_0^1 |R_C(s)|^2 \, ds \right)^{\frac{1}{2}} * \left( \int_0^1 |\Theta_C(s)|^2 \, ds \right)^{\frac{1}{2}},$$

where $R(s)$ is the radial function over a normalized polygon edge length s for a unique polygon (C) and $\Theta(s)$ is the angular function of the normalized polygon edge length s for the unique polygon (C).

19. The processor of claim 15, further including forming a distance matrix of a plurality of minimized total distance metrics corresponding to a plurality of clips.

20. The processor of claim 15, wherein the eight transformations include rotating the first clip by 0, 90, 180, or 270 degrees and providing an x or y mirror.

21. The processor of claim 15, further including smoothing an edge of at least one of the first and second unmatched polygons.

22. A method of characterizing a plurality of clips of an integrated circuit layout for clustering, at least one clip including multiple polygons, the method comprising:
identifying polygons of a first clip and a second clip;
for a first unmatched polygon in the first clip, finding a second unmatched polygon in the second clip where a distance metric between the first and second unmatched polygons is minimized, the distance metric being computed using a processor by integrating differences of radial and angular functions of the first unmatched polygon in the first clip and the second unmatched polygon in the second clip, the distance metric providing a quantitative measure of similarity;
determining whether the distance metric is a matched distance or an unmatched distance;
for each remaining unmatched polygon in the first clip, repeating the steps of finding, setting, and determining;
computing a total distance for the first and second clips by summing all matched distances and all unmatched distances;
reiterating the steps of finding, determining, and repeating for each of eight transformations of the first clip, a transformation being a reflection or a rotation of the first clip; and
determining a minimized total distance metric from the eight transformations, wherein the minimized total distance determines whether the first and second clips should be clustered,
wherein the method is performed by a computer.

* * * * *

UNITED STATES PATENT AND TRADEMARK OFFICE
CERTIFICATE OF CORRECTION

PATENT NO. : 8,490,030 B1
APPLICATION NO. : 13/487047
DATED : July 16, 2013
INVENTOR(S) : Charles C. Chiang et al.

It is certified that error appears in the above-identified patent and that said Letters Patent is hereby corrected as shown below:

On the Title Page:

(56) References Cited
OTHER PUBLICATIONS, amend

"Ganti, Venkaesh; et al. "Clutsering Large Datasets in Arbitary Metric Spaces", 15th International Conference on Data Engineering, Mar. 23-26, 1999, pp. 502-511."

to

--Ganti, Venkatesh; et al. "Clustering Large Datasets in Arbitary Metric Spaces", 15th International Conference on Data Engineering, Mar. 23-26, 1999, pp. 502-511.--.

(57) ABSTRACT
Line 1, amend "An" to --A--.

In the Claims:

Column 18
Line 47, insert --metric-- before "determines".
Line 60, insert --the-- before "radial".
Line 61, insert --s-- after "length".

Column 19
Line 10, insert --the-- before "calculating".

Column 20
Line 3, insert --metric-- before "determines".
Line 15, insert --the-- before "radial".

Signed and Sealed this
Thirtieth Day of September, 2014

Michelle K. Lee
*Deputy Director of the United States Patent and Trademark Office*

Line 16, insert --s-- after "length".
Line 34, insert --the-- before "calculating".

Column 21
Line 25, insert --metric-- before "determines".
Line 37, insert --the-- before "radial".
Line 38, insert --s-- after "length".

Column 22
Line 1, insert --the-- before "calculating".
Line 40, delete ", setting,".
Line 45, amend "finding, determining," to --finding and determining,--.
Line 51, insert --metric-- before "determines".